US012656420B2

(12) United States Patent
Halawani et al.

(10) Patent No.: US 12,656,420 B2
(45) Date of Patent: Jun. 16, 2026

(54) 3D DIFFERENTIAL SENSOR

(71) Applicant: Allegro MicroSystems, LLC, Manchester, NH (US)

(72) Inventors: Ahmad Nour Halawani, Heidelberg (DE); Emil Pavlov, Heidelberg (DE); Lorena Perdigon Toro, Heidelberg (DE); Sarkis Dono, Ulm (DE)

(73) Assignee: Allegro MicroSystems, LLC, Manchester, NH (US)

( * ) Notice: Subject to any disclaimer, the term of this patent is extended or adjusted under 35 U.S.C. 154(b) by 162 days.

(21) Appl. No.: 18/663,302

(22) Filed: May 14, 2024

(65) Prior Publication Data

US 2025/0355064 A1      Nov. 20, 2025

(51) Int. Cl.
| | |
|---|---|
| *G01R 33/07* | (2006.01) |
| *G01D 5/14* | (2006.01) |
| *H10N 52/00* | (2023.01) |
| *H10N 52/80* | (2023.01) |

(52) U.S. Cl.
CPC .......... *G01R 33/077* (2013.01); *G01D 5/145* (2013.01); *H10N 52/101* (2023.02); *H10N 52/80* (2023.02)

(58) Field of Classification Search
CPC .... G01R 33/077; G01D 5/145; H10N 52/101; H10N 52/80
USPC .................... 324/207.2, 207.13, 207.11, 200
See application file for complete search history.

(56) References Cited

U.S. PATENT DOCUMENTS

| | | | |
|---|---|---|---|
| 8,922,206 | B2 | 12/2014 | Friedrich et al. |
| 9,062,990 | B2 * | 6/2015 | Petrie .................... G01R 33/077 |
| 9,411,023 | B2 | 8/2016 | Friedrich et al. |
| 9,417,295 | B2 | 8/2016 | Friedrich et al. |
| 9,541,424 | B2 | 1/2017 | Friedrich et al. |
| 9,606,190 | B2 | 3/2017 | Friedrich et al. |
| 9,664,752 | B2 | 5/2017 | Monreal et al. |
| 9,733,106 | B2 | 8/2017 | Judkins, III et al. |
| 9,851,221 | B2 * | 12/2017 | Lang ...................... G01D 5/145 |
| 9,857,247 | B2 * | 1/2018 | Huber ............... G01R 33/0035 |
| 9,897,464 | B2 | 2/2018 | Judkins, III et al. |
| 9,983,275 | B2 | 5/2018 | Bandiera |
| 9,989,599 | B2 | 6/2018 | Bandiera |
| 10,132,879 | B2 | 11/2018 | Latham et al. |
| 10,386,427 | B1 | 8/2019 | Friedrich et al. |
| 10,527,703 | B2 | 1/2020 | Monreal et al. |
| 10,908,232 | B2 | 2/2021 | Latham et al. |
| 11,163,021 | B2 | 11/2021 | Friedrich et al. |
| 11,320,497 | B2 * | 5/2022 | Hammerschmidt ... G01R 33/02 |
| 11,408,945 | B2 | 8/2022 | Petrie et al. |

(Continued)

OTHER PUBLICATIONS

U.S. Appl. No. 18/817,513, filed Aug. 28, 2024, Klebanov et al.

(Continued)

*Primary Examiner* — Giovanni Astacio-Oquendo
(74) *Attorney, Agent, or Firm* — DALY, CROWLEY, MOFFORD & DURKEE, LLP

(57) ABSTRACT

Method and apparatus for a 3D sensor having die Hall element clusters located on first and second die. In an embodiment, a sensor IC package includes a first die having first, second, and third Hall clusters having different axes of magnetic field sensitivity and a second die having a fourth Hall cluster having sensitivity in the first and third axes of sensitivity. The sensor provides 3D field sensing for stroke, end of shaft and side shaft sensing applications.

27 Claims, 8 Drawing Sheets

(56) References Cited

U.S. PATENT DOCUMENTS

| | | | |
|---|---|---|---|
| 11,555,868 B2 | 1/2023 | Romero et al. | |
| 11,630,130 B2 | 4/2023 | Rubinsztain et al. | |
| 11,894,844 B1 | 2/2024 | Hein | |
| 2006/0028204 A1* | 2/2006 | Oohira | G01D 5/145 |
| | | | 324/207.25 |
| 2017/0268903 A1* | 9/2017 | Kranz | G01D 5/145 |
| 2019/0195656 A1* | 6/2019 | Kim | G01D 5/145 |
| 2020/0088546 A1* | 3/2020 | Sirohiwala | G01D 5/145 |
| 2023/0062642 A1* | 3/2023 | Romero | G01R 33/0017 |

OTHER PUBLICATIONS

U.S. Appl. No. 18/734,254, filed Jun. 5, 2024, Nour et al.
Allegro MicroSystems, LLC, "3D Hall-Effect Angle and Linear Position Sensor IC;" Data Sheet A31312; Jun. 2, 2022; 92 Pages.

* cited by examiner

3D DIFFERENTIAL SENSOR

BACKGROUND

As is known in art, magnetic field sensors may measure change in a magnetic field due to a moving target, for example. Some magnetic-field angle sensors measure a direction of a magnetic-field vector through 360° in one or two planes. In one example, a magnetic-field angle sensor may be used to detect an angular position of a rotating magnet. Some magnetic-field angle sensors may include one or more Hall elements arranged to sense in a given plane.

SUMMARY

Example embodiments of the disclosure provide methods and apparatus for a magnetic field sensor that differentially measures magnetic field changes in three dimensions (3D), such as XY, XZ and YZ planes. In embodiments, first and second die include Hall element clusters positioned to differentially sense in different planes. Example embodiments provide a sensor IC package having Hall element clusters configured to differentially sense in three dimensions linear and/or rotational movement, such as stroke, side shaft and/or end of shaft movement.

In one aspect, a device comprises: a first die having: a first Hall element cluster having magnetic field sensitivity in a first plane of sensitivity; a second Hall element cluster having sensitivity in a second plane of sensitivity; and a third Hall element cluster having sensitivity in the first and second planes of sensitivity and a third plane of sensitivity, wherein the first, second and third planes of sensitivity are orthogonal; and a second die having a fourth Hall element cluster having sensitivity in the third plane of sensitivity, wherein the first and second die are opposed and spaced apart by a given distance, wherein the first, second, third and fourth Hall element clusters are configured to provide differential sensing in three dimensions.

A device can further include one or more of the following features: the first and third Hall element clusters provide differential sensing in the first plane, the second and third Hall element clusters provide differential sensing in the second plane, the third and fourth Hall element clusters provide differential sensing in the third plane, the first, second, and third planes of sensitivity respectively correspond to XZ, YZ, and XY, where X, Y, and X axes in a 3D coordinate system, exactly nine Hall elements in the first, second, third, and fourth Hall element clusters provide the differential sensing in three dimensions, the device is configured to sense movement in relation to a target located in any of a stroke, side shaft and end of shaft configuration, the first and second die have identical cluster locations and Hall element configurations, the device comprises an angle sensor, the device comprises an angle sensor IC package, the first die includes fifth and sixth Hall element clusters and the second die includes seventh, eighth, ninth, and tenth Hall element clusters for redundant sensing in the first, second, and/or third planes of sensitivity, the first and second die have identical configurations, and/or a sensing controller to turn off and on ones of the Hall elements in the Hall clusters.

In another aspect, a method comprises: employing a first die having: a first Hall element cluster having magnetic field sensitivity in a first plane of sensitivity; a second Hall element cluster having sensitivity in a second plane of sensitivity; and a third Hall element cluster having sensitivity in the first and second planes of sensitivity and a third plane of sensitivity, wherein the first, second and third planes of sensitivity are orthogonal; and employing a second die having a fourth Hall element cluster having sensitivity in the third plane of sensitivity, wherein the first and second die are opposed and spaced apart by a given distance, wherein the first, second, third and fourth Hall element clusters are configured to provide differential sensing in three dimensions.

A method can further include one or more of the following features: the first and third Hall element clusters provide differential sensing in the first plane, the second and third Hall element clusters provide differential sensing in the second plane, the third and fourth Hall element clusters provide differential sensing in the third plane, the first, second, and third planes of sensitivity respectively correspond to XZ, YZ, and XY, where X, Y, and X axes in a 3D coordinate system, exactly nine Hall elements in the first, second, third, and fourth Hall element clusters provide the differential sensing in three dimensions, the device is configured to sense movement in relation to a target located in any of a stroke, side shaft and end of shaft configuration, the first and second die have identical cluster locations and Hall element configurations, the device comprises an angle sensor, the device comprises an angle sensor IC package, the first die includes fifth and sixth Hall element clusters and the second die includes seventh, eighth, ninth, and tenth Hall element clusters for redundant sensing in the first, second, and/or third planes of sensitivity, the first and second die have identical configurations, and/or a sensing controller to turn off and on ones of the Hall elements in the Hall clusters.

In a further aspect, a device comprises: a first die having: a first Hall element cluster having magnetic field sensitivity in a first axis of sensitivity; a second Hall element cluster having sensitivity in a second axis of sensitivity; and a third Hall element cluster having sensitivity in the first and second axes of sensitivity and a third axis of sensitivity, wherein the first, second and third axes of sensitivity are orthogonal; and a second die having a fourth Hall element cluster having sensitivity in the third axis of sensitivity, wherein the first and second die are opposed and spaced apart by a given distance, wherein the first, second, third and fourth Hall element clusters are configured to provide differential sensing in three dimensions.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
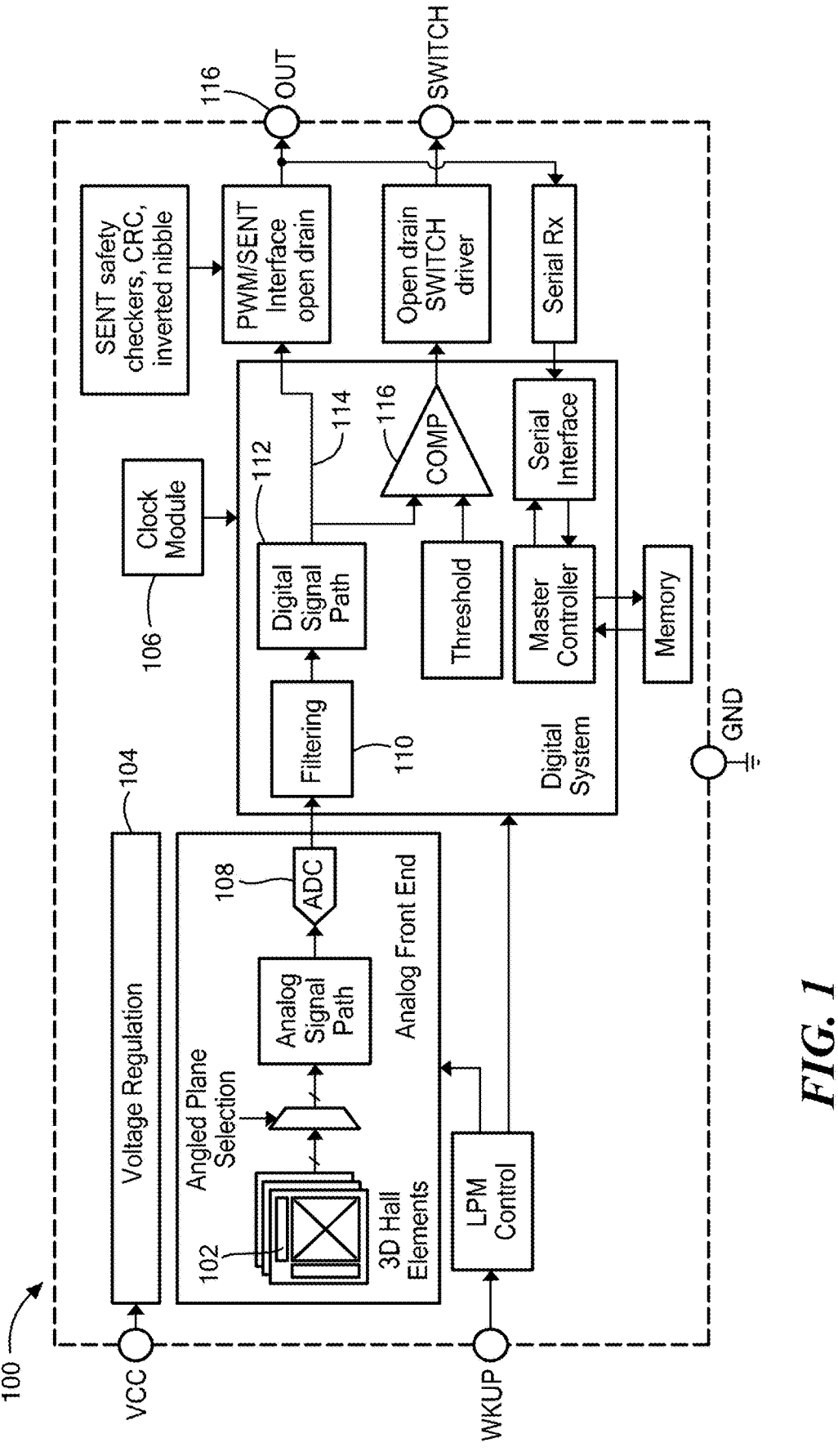
FIG. 1 is a block diagram of a 3D differential sensor in accordance with example embodiments of the disclosure.

FIG. 1 shows a block diagram of an example magnetic field sensor 100 providing differential 3D Hall-effect angle and linear position sensing integrated circuit (IC). A series of planar and vertical Hall elements 102 are located in clusters for differential sensing of magnetic field changes in three dimensions, which can be referred to XY, XZ, and YZ planes, as described more fully below. In differential modes, the difference in flux densities between Hall plate arrays is calculated and an angle derived from the resulting differential flux densities. In this mode, common mode stray fields, applied to both Hall plate arrays, are rejected making the sensor stray field robust.

In the illustrated embodiment, a voltage regulator 104 provides voltage levels needed for various components of the IC. A clock module 106 provides any needed clock signals for processing of signals from the Hall elements 102.

In the illustrated embodiment, signals from the Hall elements 102 are digitized by respective ADCs 108 and filtered 110. A digital signal path module 112 receives the filtered data and processes the data to determine angular position of a target for example, by using CORDIC, arctangent or other suitable circuitry. The angle signal 114 may be output from the IC 100 on a output terminal 116 via a serial interface connected to a remote device, such as an engine control unit (ECU), for example. The angle signal 114 can also be thresholded by a comparator 118 the output of which can be output from the IC on a switch terminal 120.

Figure 2:
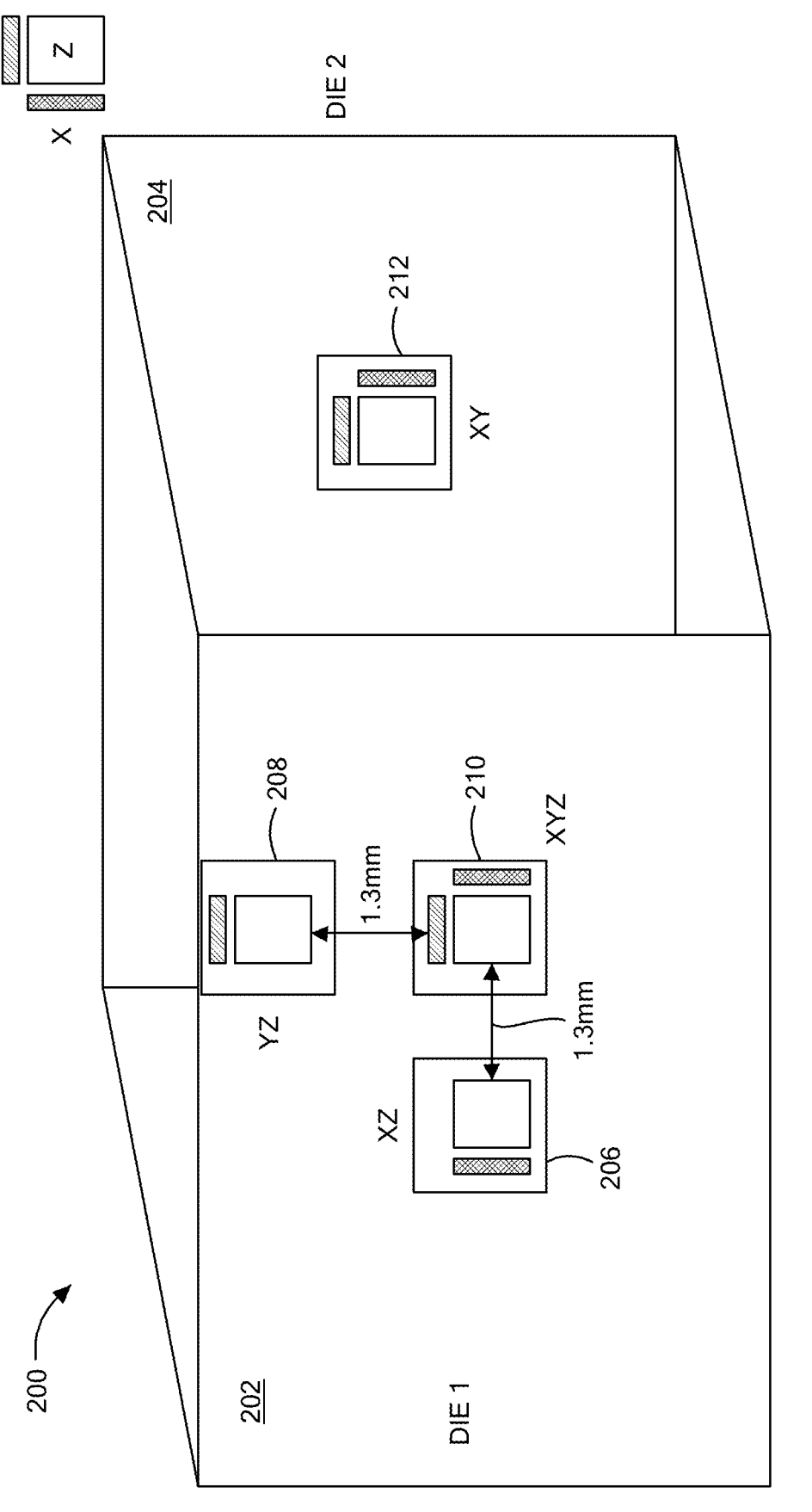
FIG. 2 is a schematic representation of a 3D sensor having a first die with a series of Hall element clusters to provide sensitivity in first and second planes of sensitivity and a second die with a Hall element cluster to provide a third plane of sensitivity with elements in the first die.

FIG. 2 shows an example embodiment of a 3D sensor 200 having opposing first and second die 202, 204 spaced apart from each other by a given distance. The first die 202 includes first, second, and third Hall clusters 206, 208, 210 and the second die 204 includes a fourth Hall cluster 212. In the illustrated embodiment, the first Hall cluster 206 includes an X element and a Z element. It is understood that first Hall cluster 206 senses magnetic field changes in the XZ plane. The second Hall cluster 208 includes a Y element and a Z element for YZ plane sensing. The third Hall cluster 210 includes an X, Y and Z Hall element.

The fourth cluster 212 on the second die 204 includes an X and a Y Hall element for XY sensing.

In operation, the first and third clusters 206, 210 provide differential sensing in the XZ plane and the second and third clusters 208, 210 provide differential sensing in the YZ plane. It is understood that differential sensing, which requires at least pairs of elements sensing in the same plane, provides stray field immunity since any stray field is canceled by the differential arrangement.

The third cluster 210 on the first die 202 and the fourth cluster 212 on the second die 204 provide differential sensing in the XY plane. With this arrangement, differential sensing is provided in XY, XZ, and YX planes.

Figure 2A:
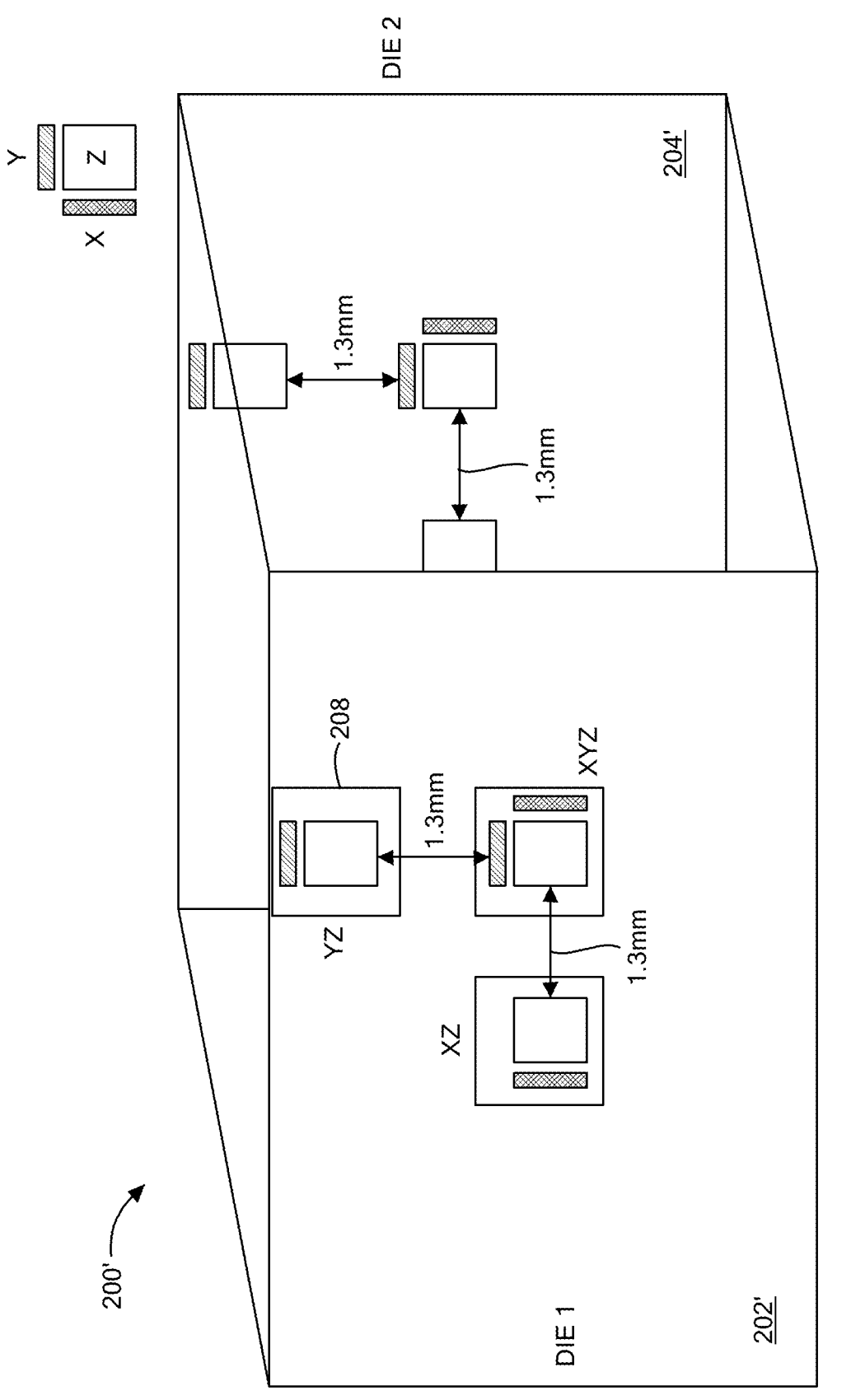
FIG. 2A is a schematic representation of a 3D sensor having similar first die and second die with Hall element clusters to provide sensitivity in first, second, and third planes of sensitivity with redundancy.

FIG. 2A shows a 3D sensor embodiment 200' having some similarity with the sensor 200 of FIG. 2A with the addition of two clusters on the second die 204' so that each die includes seven Hall elements. In embodiments, the first and second die 202', 204' may have identical Hall element locations. That is, the first and second die may be identical. With this arrangement, redundant sensing is provided for YZ and XZ sensing.

Figure 2B:
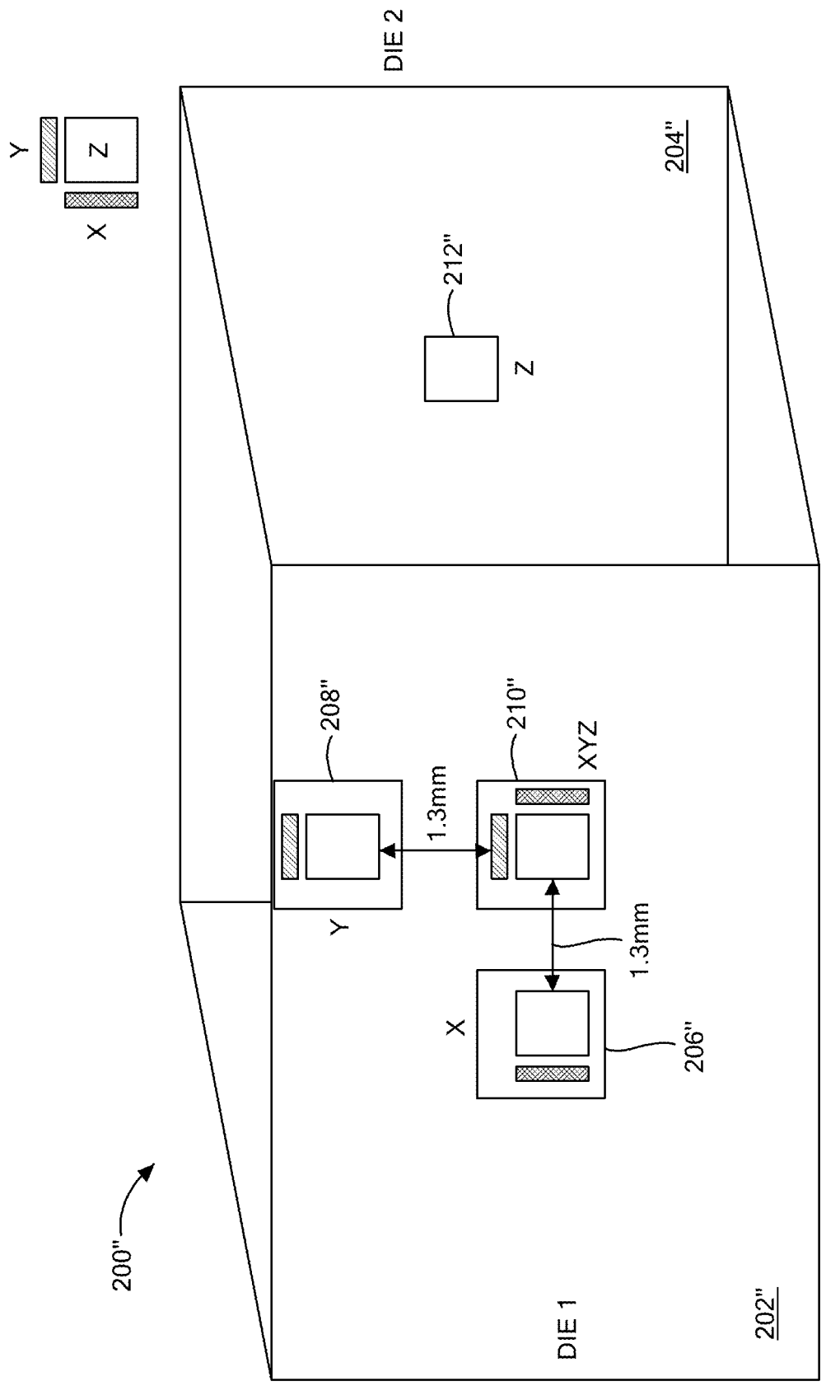
FIG. 2B is a schematic representation of a 3D sensor having a first die with five Hall elements and second die with one Hall element to provide sensitivity in first, second, and third axes of sensitivity.

FIG. 2B shows a 3D sensor embodiment 200" having some similarity with the sensor 200 of FIG. 2A but with five Hall elements on the first die 202" and one element on the second die 204". In the illustrated embodiment, the first Hall cluster 206" includes an X Hall element, the second Hall cluster 208" includes a Y Hall element, and the third Hall cluster includes 210" X, Y and Z Hall elements. The second die 204" includes a fourth Hall cluster 212" having a Z Hall element. With this arrangement, differential sensing is provided in three axes.

Figure 3:
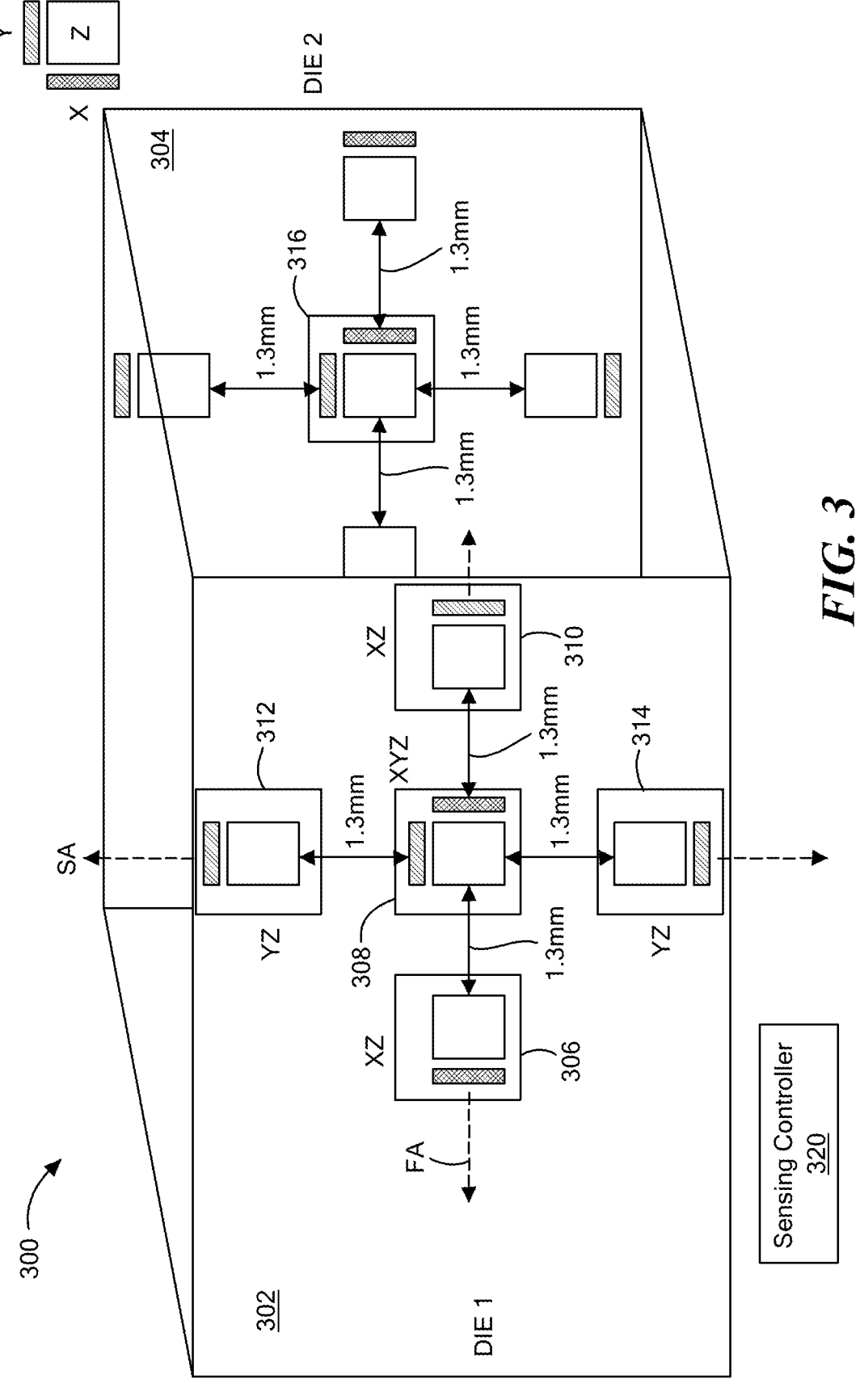
FIG. 3 is a schematic representation of a 3D sensor having similar first die and second die with Hall element clusters to provide sensitivity in first, second, and third planes of sensitivity with redundancy.

FIG. 3 shows a sensor 300 having eleven Hall elements on each of first and second die 302, 304. In an example embodiment, first, second and third clusters 306, 308, 310 are positioned on a first axis FA extending across the first die 302. Fourth and fifth clusters 312, 314 are separated by the second cluster 308 so that the fourth fifth and second cluster are positioned on a second axis SA, which is perpendicular to the first axis FA. The clusters form a cross in the first die 302.

The first and third clusters 306, 310, include X and Z Hall elements and the second cluster 308 includes X, Y, and Z elements. Due to the advantages provided by greater spacing distance, in embodiments, the first and third clusters 306, 310 are used for differential sensing in the XZ plane and the fourth and fifth clusters 312, 314 are used for differential sensing in the YZ plane.

Differential sensing in the XY plane is provided by X and Y elements in the second cluster 308 in the first die 302 and X and Y elements in a corresponding cluster 316 in the second die 304.

In the illustrated embodiment, the first and second die 302, 304 have similar, if not identical Hall elements at the same locations. With this arrangement, a 3D sensor can obtain differential measurements in X, Y and Z directions.

It is understood that the clusters in FIG. 3 provide a wide variety of possible redundancy configurations, as well as using some number of elements on one or both die to increase the number of elements used to generate angle information.

In an example embodiment, the sensor includes a sensing controller 320 coupled to the clusters that can turn on and off any of the clusters and/or elements within a cluster. The sensing controller 320 may be located on the first and/or second die 302, 304 or be located remotely. With this arrangement, power is saved and sensing pairs that best fit application requirements can be selected. In addition, a wide range of redundancy configurations can be implemented by controlling one or more Hall elements in one or more clusters on one or more die.

It is understood that example dimensions are shown to facilitate an understanding of illustrative embodiments of the disclosure and are not intended to limit the scope of the invention as claimed in any way.

Figure 4B:
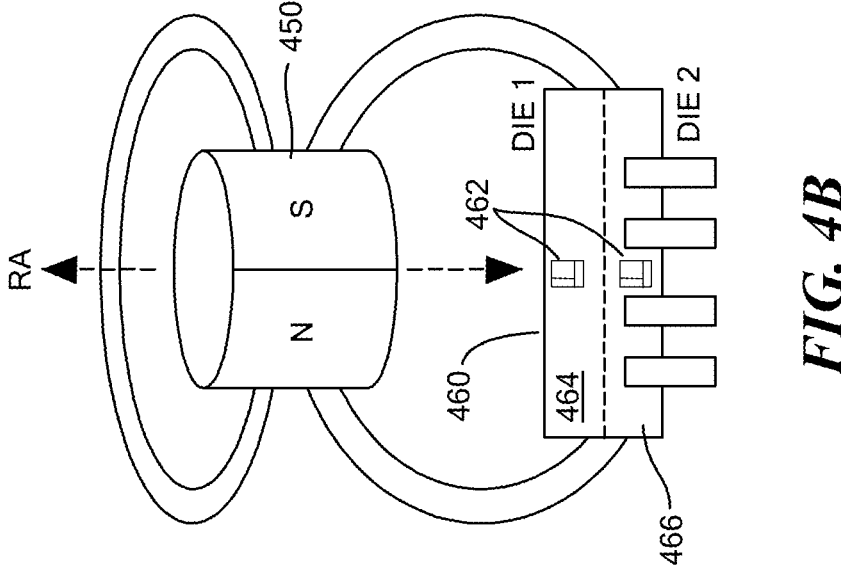
FIG. 4B shows end of shaft.
Figure 4A:
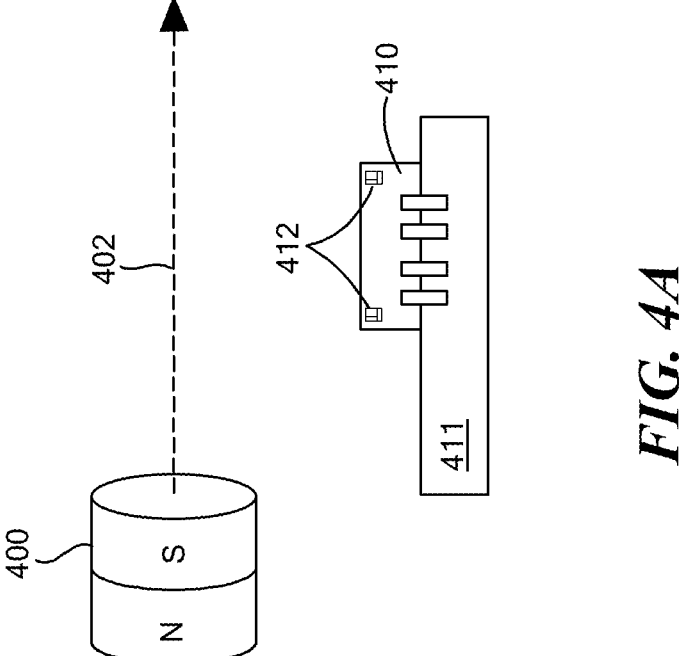
FIG. 4A shows stroke movement.
Figure 4C:
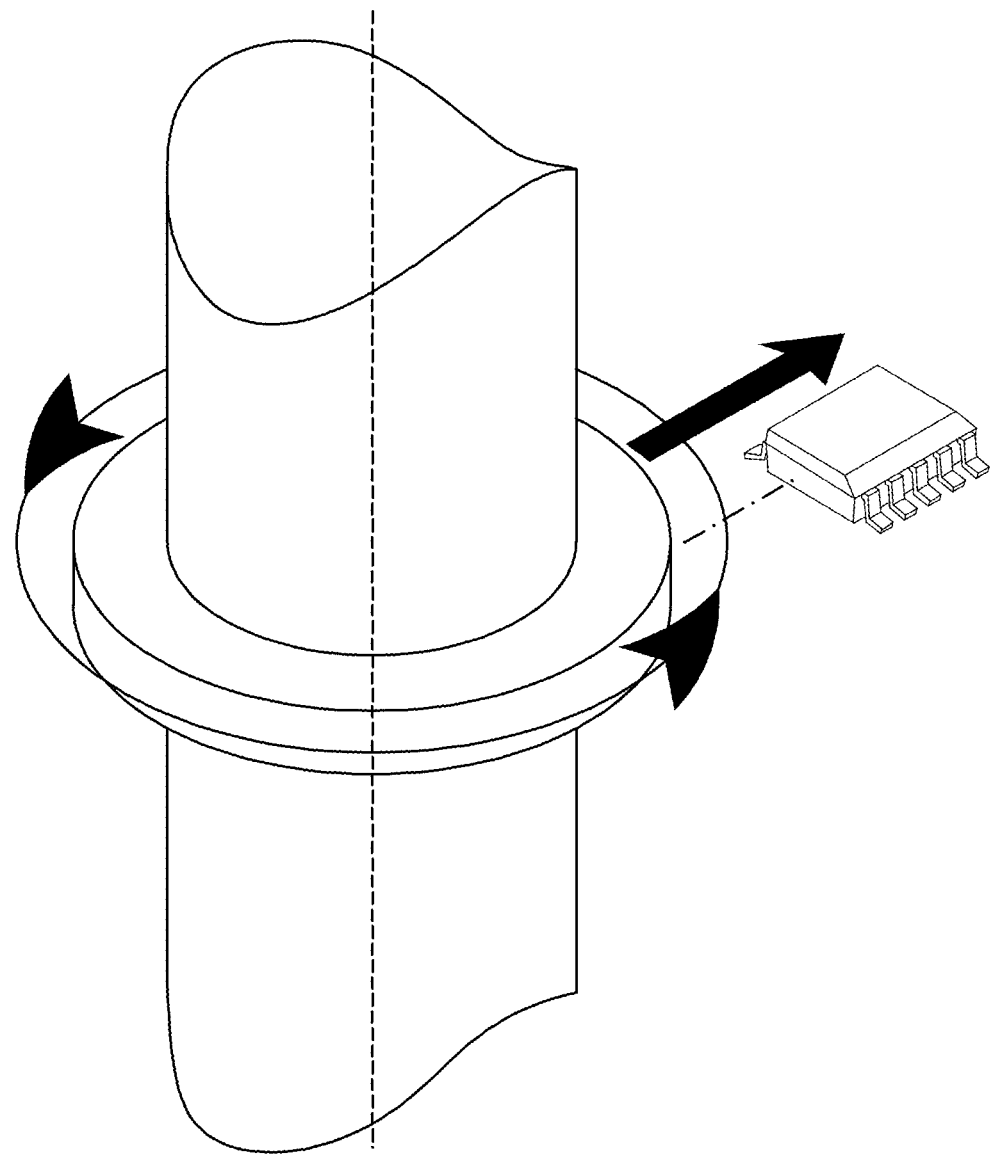
FIG. 4C shows side shaft sensing configurations provided by a 3D sensor in accordance with example embodiments of the disclosure.

FIG. 4A shows a magnetic target 400 that may move alone line 402 in a stroke motion that can be detected by a 3D sensor 410 on a printed circuit board 411 having first and second clusters 412 that can detect target movement, as described above. FIG. 4B shows a magnetic target 450 in an end-of-shaft position that rotates about an axis RA with a 3D sensor 460 having clusters in first and second die 464, 466 to detect movement of the target. In contrast to non-3D sensors, the axis RA can be aligned with the clusters on the first and second die. In embodiments, clusters that are not aligned with the axis RA are turned off. In another embodiment, a sensor can detect target movement in a side-shaft position, as shown in FIG. 4C.

In some known sensors for end of shaft sensing, an end of shaft axis is offset from center, such as aligned with one cluster in a cluster pair on die, e.g., the axis is aligned with the left cluster of a left/right cluster pair. However, this arrangement may have limited accuracy.

Figure 5:
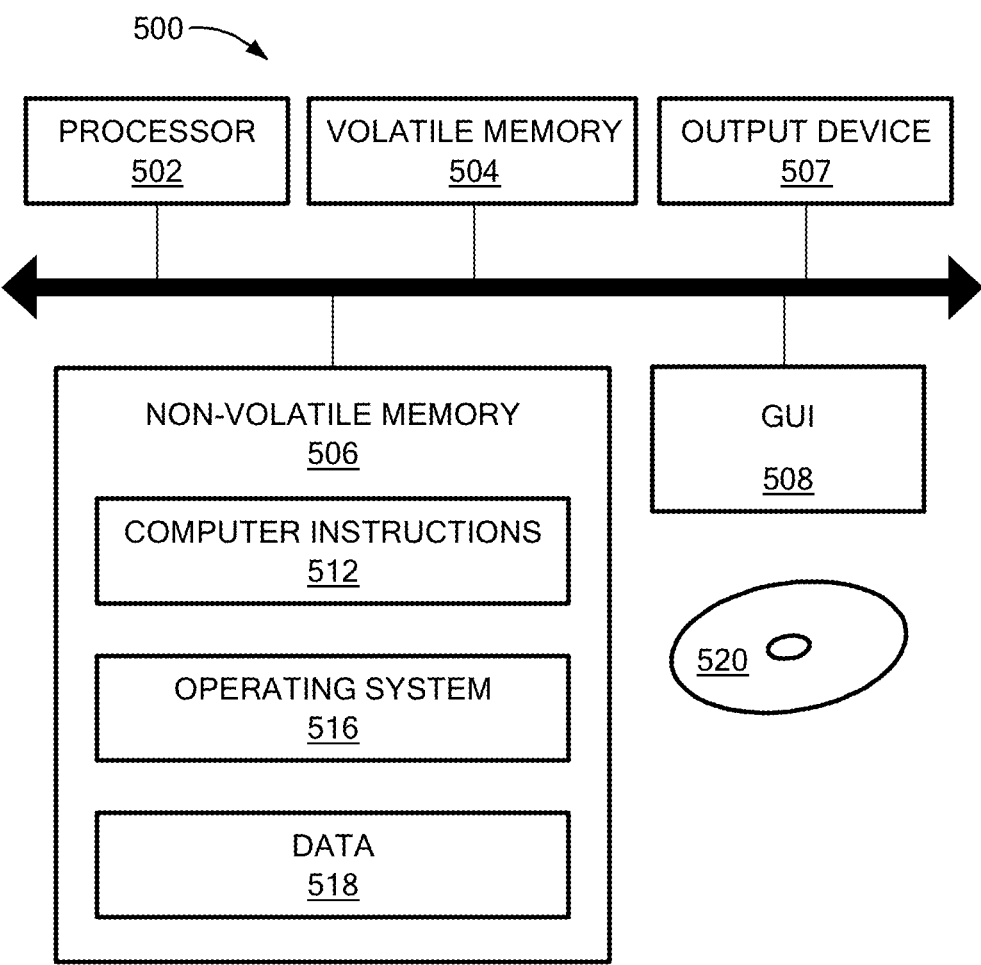
FIG. 5 is a schematic representation of an example processor or computer that can perform at least a portion of the processing described herein.

FIG. 5 shows an exemplary computer 500 that can perform at least part of the processing described herein, such as the processing of Hall element signals and controlling which elements are active at any given time. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable comput-ers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable proces-sor, a computer, or multiple computers). Each such program may be implemented in a high level procedural or object-oriented programming language to communicate with a computer system. However, the programs may be imple-mented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more program-mable processors executing one or more computer programs to perform the functions of the system. All or part of the system may be implemented as, special purpose logic cir-cuitry (e.g., an FPGA (field programmable gate array) and/or an ASIC (application-specific integrated circuit)).

All references cited herein are hereby incorporated herein by reference in their entirety. Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. A device, comprising:
a first die having:
    a first Hall element cluster having magnetic field sen-sitivity in a first plane of sensitivity;
    a second Hall element cluster having sensitivity in a second plane of sensitivity; and
    a third Hall element cluster having sensitivity in the first and second planes of sensitivity and a third plane of sensitivity, wherein the first, second and third planes of sensitivity are orthogonal; and
a second die having a fourth Hall element cluster having sensitivity in the third plane of sensitivity, wherein the first and second die are opposed and spaced apart by a given distance, wherein the first, second, third and fourth Hall element clusters are configured to provide differential sensing in three dimensions.
2. The device according to claim 1, wherein the first and third Hall element clusters provide differential sensing in the first plane.
3. The device according to claim 1, wherein the second and third Hall element clusters provide differential sensing in the second plane.
4. The device according to claim 1, wherein the third and fourth Hall element clusters provide differential sensing in the third plane.
5. The device according to claim 1, wherein the first, second, and third planes of sensitivity respectively corre-spond to XZ, YZ, and XY, where X, Y, and X axes in a 3D coordinate system.
6. The device according to claim 1, wherein exactly nine Hall elements in the first, second, third, and fourth Hall element clusters provide the differential sensing in three dimensions.
7. The device according to claim 1, wherein the device is configured to sense movement in relation to a target located in any of a stroke, side shaft and end of shaft configuration.
8. The device according to claim 1, wherein the first and second die have identical cluster locations and Hall element configurations.
9. The device according to claim 1, wherein the device comprises an angle sensor.
10. The device according to claim 1, wherein the device comprises an angle sensor IC package.
11. The device according to claim 1, wherein the first die includes fifth and sixth Hall element clusters and the second die includes seventh, eighth, ninth, and tenth Hall element clusters for redundant sensing in the first, second, and/or third planes of sensitivity.
12. The device according to claim 11, wherein the first and second die have identical configurations.
13. The device according to claim 11, further including a sensing controller to turn off and on ones of the Hall elements in the Hall clusters.
14. A method, comprising
employing a first die having:
    a first Hall element cluster having magnetic field sen-sitivity in a first plane of sensitivity;
    a second Hall element cluster having sensitivity in a second plane of sensitivity; and
    a third Hall element cluster having sensitivity in the first and second planes of sensitivity and a third plane of sensitivity, wherein the first, second and third planes of sensitivity are orthogonal; and employing a second die having a fourth Hall element cluster having sensitivity in the third plane of sensitivity, wherein the first and second die are opposed and spaced apart by a given distance, wherein the first, second, third and fourth Hall element clusters are configured to provide differential sensing in three dimensions.

15. The method according to claim 14, wherein the first and third Hall element clusters provide differential sensing in the first plane.

16. The method according to claim 14, wherein the second and third Hall element clusters provide differential sensing in the second plane.

17. The method according to claim 14, wherein the third and fourth Hall element clusters provide differential sensing in the third plane.

18. The method according to claim 14, wherein the first, second, and third planes of sensitivity respectively correspond to XZ, YZ, and XY, where X, Y, and X axes in a 3D coordinate system.

19. The method according to claim 14, wherein exactly nine Hall elements in the first, second, third, and fourth Hall element clusters provide the differential sensing in three dimensions.

20. The method according to claim 14, wherein the device is configured to sense movement in relation to a target located in any of a stroke, side shaft and end of shaft configuration.

21. The method according to claim 14, wherein the first and second die have identical cluster locations and Hall element configurations.

22. The method according to claim 14, wherein the device comprises an angle sensor.

23. The method according to claim 14, wherein the device comprises an angle sensor IC package.

24. The method according to claim 14, wherein the first die includes fifth and sixth Hall element clusters and the second die includes seventh, eighth, ninth, and tenth Hall element clusters for redundant sensing in the first, second, and/or third planes of sensitivity.

25. The method according to claim 24, wherein the first and second die have identical configurations.

26. The method according to claim 24, further including a sensing controller to turn off and on ones of the Hall elements in the Hall clusters.

27. A device, comprising:

a first die having:

a first Hall element cluster having magnetic field sensitivity in a first axis of sensitivity;

a second Hall element cluster having sensitivity in a second axis of sensitivity; and a third Hall element cluster having sensitivity in the first and second axes of sensitivity and a third axis of sensitivity, wherein the first, second and third axes of sensitivity are orthogonal; and a second die having a fourth Hall element cluster having sensitivity in the third axis of sensitivity, wherein the first and second die are opposed and spaced apart by a given distance, wherein the first, second, third and fourth Hall element clusters are configured to provide differential sensing in three dimensions.

* * * * *